(12) United States Patent
Alhawi et al.

(10) Patent No.: US 12,019,202 B2
(45) Date of Patent: Jun. 25, 2024

(54) FAST VARIOGRAM MODELING DRIVEN BY ARTIFICIAL INTELLIGENCE

(71) Applicant: SAUDI ARABIAN OIL COMPANY, Dhahran (SA)

(72) Inventors: Maan Abdullah Alhawi, Dammam (SA); Marei Saeed Al-Garni, Dhahran (SA); Mohammed Sabri Al Madani, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 763 days.

(21) Appl. No.: 17/212,363

(22) Filed: Mar. 25, 2021

(65) Prior Publication Data
US 2022/0308256 A1  Sep. 29, 2022

(51) Int. Cl.
| | |
|---|---|
| G06F 30/27 | (2020.01) |
| E21B 41/00 | (2006.01) |
| E21B 49/00 | (2006.01) |
| G01V 20/00 | (2024.01) |
| G05B 13/02 | (2006.01) |
| G06N 3/045 | (2023.01) |
| G06N 3/086 | (2023.01) |

(52) U.S. Cl.
CPC ............ *G01V 20/00* (2024.01); *E21B 41/00* (2013.01); *E21B 49/00* (2013.01); *G05B 13/027* (2013.01); *G06F 30/27* (2020.01); *G06N 3/045* (2023.01); *G06N 3/086* (2013.01); *E21B 2200/20* (2020.05); *E21B 2200/22* (2020.05)

(58) Field of Classification Search
CPC ........ G01V 20/00; G06F 30/27; G06N 3/045; G06N 3/086; G05B 13/027; E21B 41/00; E21B 49/00
USPC ...................................................... 703/9, 10
See application file for complete search history.

(56) References Cited

U.S. PATENT DOCUMENTS

| | | |
|---|---|---|
| 8,849,622 B2 | 9/2014 | Melkumyan et al. |
| 2007/0016389 A1 | 1/2007 | Ozgen |

(Continued)

FOREIGN PATENT DOCUMENTS

| | | |
|---|---|---|
| CN | 108897042 B | 3/2020 |
| CN | 111670438 A | 9/2020 |

(Continued)

OTHER PUBLICATIONS

Ávalos, Sebastián and Julián M. Ortiz, "Geological modeling using Recursive Convolutional Neural Networks", Apr. 2019, pp. 1-8 (8 pages).

(Continued)

*Primary Examiner* — Andre Pierre Louis
(74) *Attorney, Agent, or Firm* — Osha Bergman Watanabe & Burton LLP

(57) ABSTRACT

A method for variogram modeling is disclosed. The method includes obtaining a synthetic well data and a well data for facies or petrophysical properties of interest in a targeted reservoir zone, training machine learning models using the synthetic well data as inputs and outputting a plurality of final variogram parameters predicted by using a plurality of machine learning models for the facies or petrophysical properties of interest in the targeted reservoir zone, wherein the well data for the facies or petrophysical properties of interest in the targeted reservoir zone is used as input.

20 Claims, 4 Drawing Sheets

(56) References Cited

U.S. PATENT DOCUMENTS

| | | | |
|---|---|---|---|
| 2020/0124764 A1 | 4/2020 | Zhang et al. | |
| 2020/0160173 A1 | 5/2020 | Pandey et al. | |
| 2020/0364597 A1 | 11/2020 | Friedlander et al. | |
| 2021/0285326 A1* | 9/2021 | Alghazal | E21B 49/02 |
| 2022/0035068 A1* | 2/2022 | Cheng | G01V 20/00 |

FOREIGN PATENT DOCUMENTS

| | | |
|---|---|---|
| CN | 112083498 A | 12/2020 |
| KR | 102067195 B1 | 1/2020 |
| KR | 102155101 B1 | 9/2020 |

OTHER PUBLICATIONS

Caers, Jef and André G. Journel, "Stochastic Reservoir Simulation Using Neural Networks Trained on Outcrop Data", SPE 49026, Society of Petroleum Engineers, Inc., Sep. 1998, pp. 1-16 (16 pages).

Dhara, Arnab et al., "Machine learning based methods for estimation and stochastic simulation", SEG International Exposition and 88th Annual Meeting, SEG, 2018, pp. 2261-2265 (5 pages).

Li, He et al., "Convolutional neural network and transfer learning based mineral prospectivity modeling for geochemical exploration of Au mineralization within the Guardian-Zhangbaling area, Anhui Province, China", Applied Geochemistry, ScienceDirect, Elsevier Ltd., vol. 122, No. 104747, Sep. 2020, pp. 1-11 (11 pages).

Li, Zhanglin et al., "An automatic variogram modeling method with high reliability fitness and estimates", Computers and Geosciences, ScienceDirect, Elsevier Ltd., vol. 120, Aug. 2018, pp. 48-59 (12 pages).

Saikia, Pallabi et al., "Artificial Neural Networks in the domain of reservoir characterization: A review from shallow to deep models", Computers and Geosciences, ScienceDirect, Elsevier Ltd., vol. 135, No. 104357, 2020, pp. 1-13 (13 pages).

Samson, Matthew, "Mineral Resource Estimates with Machine Learning and Geostatistics", University of Alberta, 2019 (112 pages).

* cited by examiner

FAST VARIOGRAM MODELING DRIVEN BY ARTIFICIAL INTELLIGENCE

BACKGROUND

Spatial and vertical variogram fitting for well data is used to control a stochastic interpolation algorithm of petrophysical properties in earth modeling. This is usually a laborious, manual process and is required to be done for each zone and for each type of facies. In most cases, the process is performed for one zone and copied across to all others, which may result in inaccurate vertical and spatial distribution of facies.

Variogram modeling to reflect the spatial distribution of the rock matrix properties is still practically useful and of widespread use in building robust and realistic earth models. However, due to building variogram being a labor-intensive process and consuming a lot of time, Global optimization algorithms like Genetic algorithm have been used widely in finding the best fitting parameters for various applications.

Global optimization algorithms such as Genetic Algorithm (GA) are usually used to find the best fit values of certain parameters known as chromosomes over a data set of observation. In GA algorithms, the parameters are generated randomly and then the fitness is computed for each iteration to measure how close the computed variogram is to the obtained subsurface data. The main challenge with (GA) is the time it takes to compute the fitness function for each parameter set and for all the randomly generated numbers. Therefore, when several iterations are added together, the computation time can be very large, which makes GA un-optimized for many time-critical processes such as live earth modeling workflows targeting optimized reservoir development.

SUMMARY

In general, in one aspect, the invention relates to a method for variogram modeling. The method includes obtaining, by a computer processor, a synthetic well data and a well data for facies of interest in a targeted reservoir zone, training, by the computer processor, a first machine learning model using the synthetic well data as inputs, outputting, by the computer processor, a plurality of variogram parameters predicted by using the pre-trained first model for the facies of interest in the targeted reservoir zone, wherein the well data for the facies of interest in the targeted reservoir zone is used as input, training, by the computer processor, a second machine learning model using the variogram parameters derived from the first machine learning model as starting parameters, wherein the well data for the facies of interest in the targeted reservoir zone is used as input, outputting, by the computer processor, a plurality of variogram parameters predicted by using the trained second model for the facies of interest in the targeted reservoir zone, wherein the well data for the facies of interest in the targeted reservoir zone is used as input, training, by the computer processor, a third machine learning model using the variogram parameters derived from the second machine learning model as starting parameters, wherein the well data for the facies of interest in the targeted reservoir zone is used as input, and outputting, by the computer processor, a plurality of final variogram parameters predicted by using the trained third model for the facies of interest in the targeted reservoir zone, wherein the well data for the facies of interest in the targeted reservoir zone is used as input.

In general, in one aspect, the invention relates to a system for variogram modeling. The system includes a processor comprising a computer processing unit capable of executing instructions stored in a non-transitory computer storage medium which causes the processor to perform functions including obtaining a synthetic well data and a well data for facies of interest in a targeted reservoir zone, training a first machine learning model using the synthetic well data as inputs, outputting a plurality of variogram parameters predicted by using the pre-trained first model for the facies of interest in the targeted reservoir zone, wherein the well data for the facies of interest in the targeted reservoir zone is used as input, training a second machine learning model using the variogram parameters derived from the first machine learning model as starting parameters, wherein the well data for the facies of interest in the targeted reservoir zone is used as input, outputting a plurality of variogram parameters predicted by using the trained second model for the facies of interest in the targeted reservoir zone, wherein the well data for the facies of interest in the targeted reservoir zone is used as input, training a third machine learning model using the variogram parameters derived from the second machine learning model as starting parameters, wherein the well data for the facies of interest in the targeted reservoir zone is used as input, and outputting a plurality of final variogram parameters predicted by using the trained third model for the facies of interest in the targeted reservoir zone, wherein the well data for the facies of interest in the targeted reservoir zone is used as input.

BRIEF DESCRIPTION OF DRAWINGS

Specific embodiments disclosed herein will now be described in detail with reference to the accompanying figures. Like elements in the various figures are denoted by like reference numerals for consistency. Like elements may not be labeled in all figures for the sake of simplicity.

DETAILED DESCRIPTION

Figure 1:
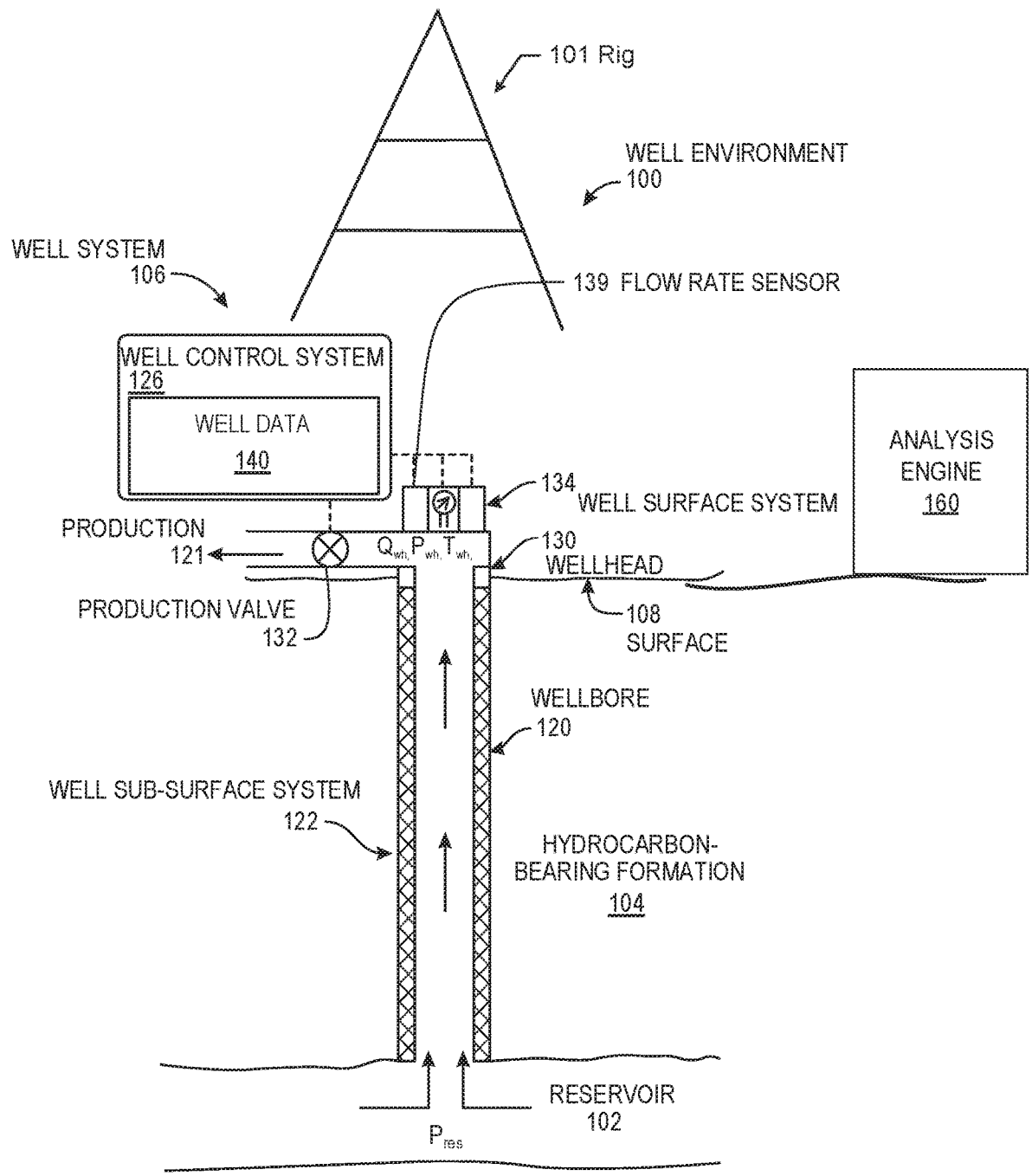
FIG. 1 shows a system in accordance with one or more embodiments.

In the following detailed description of embodiments disclosed herein, numerous specific details are set forth in order to provide a more thorough understanding disclosed herein. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-4, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that, one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments disclosed herein provide a method, a computer system, and a non-transitory computer readable medium for variogram modeling. In the field of spatial statistics, a variogram is a function that characterizes the spatial covariance structure of a stochastic process. It is defined as the variance of the differences between response surface values computed at pairs of points at different locations across the factor space. In adopting this concept for the analysis of reservoir characterization, it is assumed that the model performance metric can be treated as a realization of a spatially stochastic process.

A fast model convergence is achieved by combining multiple layers of models, one of which is pre-trained on synthetic data using a deep learning system, such that it is used to suggest initial parameters that are close to best fit values. In one or more embodiments, the deep learning system is trained to find the parameters of variogram for any dataset correctly. These initial parameters are also fed to a local optimization algorithm to calibrate their values to match observation data being modeled. Finally, tuned parameters are then used to constitute the first genome to genetics algorithm (GA) optimization process. Using this approach, a significant decrease is expected in the required processing time of variogram fitting parameters as opposed to using the genetic algorithm alone.

The main technical advantage of proposed disclosure is the capability to converge to best fit parameters quicker which gives it more potential for practical usage in operation-based requirements and time critical decisions. This disclosure is advantageous over high quality variogram modeling has been based on genetic algorithm along with objective function combining both cross validation and weighted least squares, as it relies on pre-trained deep leaning convolutional neural net model to converge to best fitting variogram parameters in a quicker way. The proposed disclosure minimizes the lag time required till the model converges to best-fit parameters.

FIG. 1 shows a schematic diagram in accordance with one or more embodiments. As shown in FIG. 1, a well environment (100) includes a hydrocarbon reservoir ("reservoir") (102) located in a subsurface hydrocarbon-bearing formation ("formation") (104) and a well system (106). The hydrocarbon-bearing formation (104) may include a porous or fractured rock formation that resides underground, beneath the earth's surface ("surface") (108). In the case of the well system (106) being a hydrocarbon well, the reservoir (102) may include a portion of the hydrocarbon-bearing formation (104). The hydrocarbon-bearing formation (104) and the reservoir (102) may include different layers of rock having varying characteristics, such as varying degrees of permeability, porosity, capillary pressure, and resistivity. In the case of the well system (106) being operated as a production well, the well system (106) may facilitate the extraction of hydrocarbons (or "production") from the reservoir (102).

In some embodiments of the invention, the well system (106) includes a rig (101), a wellbore (120), a well subsurface system (122), a well surface system (134), and a well control system ("control system") (126). The well control system (126) may control various operations of the well system (106), such as well production operations, well drilling operation, well completion operations, well maintenance operations, and reservoir monitoring, assessment and development operations. In some embodiments, the well control system (126) includes a computer system that is the same as or similar to that of a computer system (400) described below in FIG. 4 and the accompanying description.

The rig (101) is the machine used to drill a borehole to form the wellbore (120). Major components of the rig (101) include the drilling fluid tanks, the drilling fluid pumps (e.g., rig mixing pumps), the derrick or mast, the draw works, the rotary table or top drive, the drill string, the power generation equipment and auxiliary equipment.

The wellbore (120) includes a bored hole (i.e., borehole) that extends from the surface (108) into a target zone of the hydrocarbon-bearing formation (104), such as the reservoir (102). An upper end of the wellbore (120), terminating at or near the surface (108), may be referred to as the "up-hole" end of the wellbore (120), and a lower end of the wellbore, terminating in the hydrocarbon-bearing formation (104), may be referred to as the "downhole" end of the wellbore (120). The wellbore (120) may facilitate the circulation of drilling fluids during drilling operations, the flow of hydrocarbon production ("production") (121) (e.g., oil and gas) from the reservoir (102) to the surface (108) during production operations, the injection of substances (e.g., water) into the hydrocarbon-bearing formation (104) or the reservoir (102) during injection operations, or the communication of monitoring devices (e.g., logging tools) lowered into the hydrocarbon-bearing formation (104) or the reservoir (102) during monitoring operations (e.g., during in situ logging operations).

In some embodiments, during operation of the well system (106), the well control system (126) collects and records well data (140) for the well system (106). During drilling operation of the well (106), the well data (140) may include mud properties, flow rates, collected by a flow rate sensor (139), drill volume and penetration rates, formation characteristics, etc. In some embodiments, the well data (140) are recorded in real-time, and are available for review or use within seconds, minutes or hours of the condition being sensed (e.g., the measurements are available within 1 hour of the condition being sensed). In such an embodiment, the well data (140) may be referred to as "real-time" well data (140). Real-time well data (140) may enable an operator of the well (106) to assess a relatively current state of the well system (106), and make real-time decisions regarding a development of the well system (106) and the reservoir (102), such as on-demand adjustments in drilling fluid and regulation of production flow from the well.

In some embodiments, the well surface system (134) includes a wellhead (130). The wellhead (130) may include a rigid structure installed at the "up-hole" end of the wellbore (120), at or near where the wellbore (120) terminates at the Earth's surface (108). The wellhead (130) may include structures for supporting (or "hanging") casing and production tubing extending into the wellbore (120). Production (121) may flow through the wellhead (130), after exiting the wellbore (120) and the well sub-surface system (122), including, for example, the casing and the production tubing. In some embodiments, the well surface system (134) includes flow regulating devices that are operable to control the flow of substances into and out of the wellbore (120). For example, the well surface system (134) may include one or more production valves (132) that are operable to control the flow of production. For example, a production valve (132) may be fully opened to enable the unrestricted flow of production (121) from the wellbore (120), the production valve (132) may be partially opened to partially restrict (or "throttle") the flow of production (121) from the wellbore (120), and production valve (132) may be fully closed to fully restrict (or "block") the flow of production (121) from the wellbore (120), and through the well surface system (134).

In some embodiments, the wellhead (130) includes a choke assembly. For example, the choke assembly may include hardware with functionality for opening and closing the fluid flow through pipes in the well system (106). Likewise, the choke assembly may include a pipe manifold that may lower the pressure of fluid traversing the wellhead. As such, the choke assembly may include a set of high pressure valves and at least two chokes. These chokes may be fixed or adjustable or a mix of both. Redundancy may be provided so that if one choke has to be taken out of service, the flow can be directed through another choke. In some embodiments, pressure valves and chokes are communicatively coupled to the well control system (126). Accordingly, a well control system (126) may obtain wellhead data regarding the choke assembly as well as transmit one or more commands to components within the choke assembly in order to adjust one or more choke assembly parameters.

In some embodiments, the well control system (126) collects and records well data (140) for the well system (106). A synthetic data generator (204) depicted in FIG. 2, may generate datasets of synthetic data (204) based on the collected well data (140). Further, the well system (106) is provided with an analysis engine (160). For example, the synthetic data generator (204), local optimizers (206) and global optimizers (203) depicted in FIG. 2 below may be part of the analysis engine (160) that includes hardware and/or software with functionality for developing variogram models.

Figure 2:
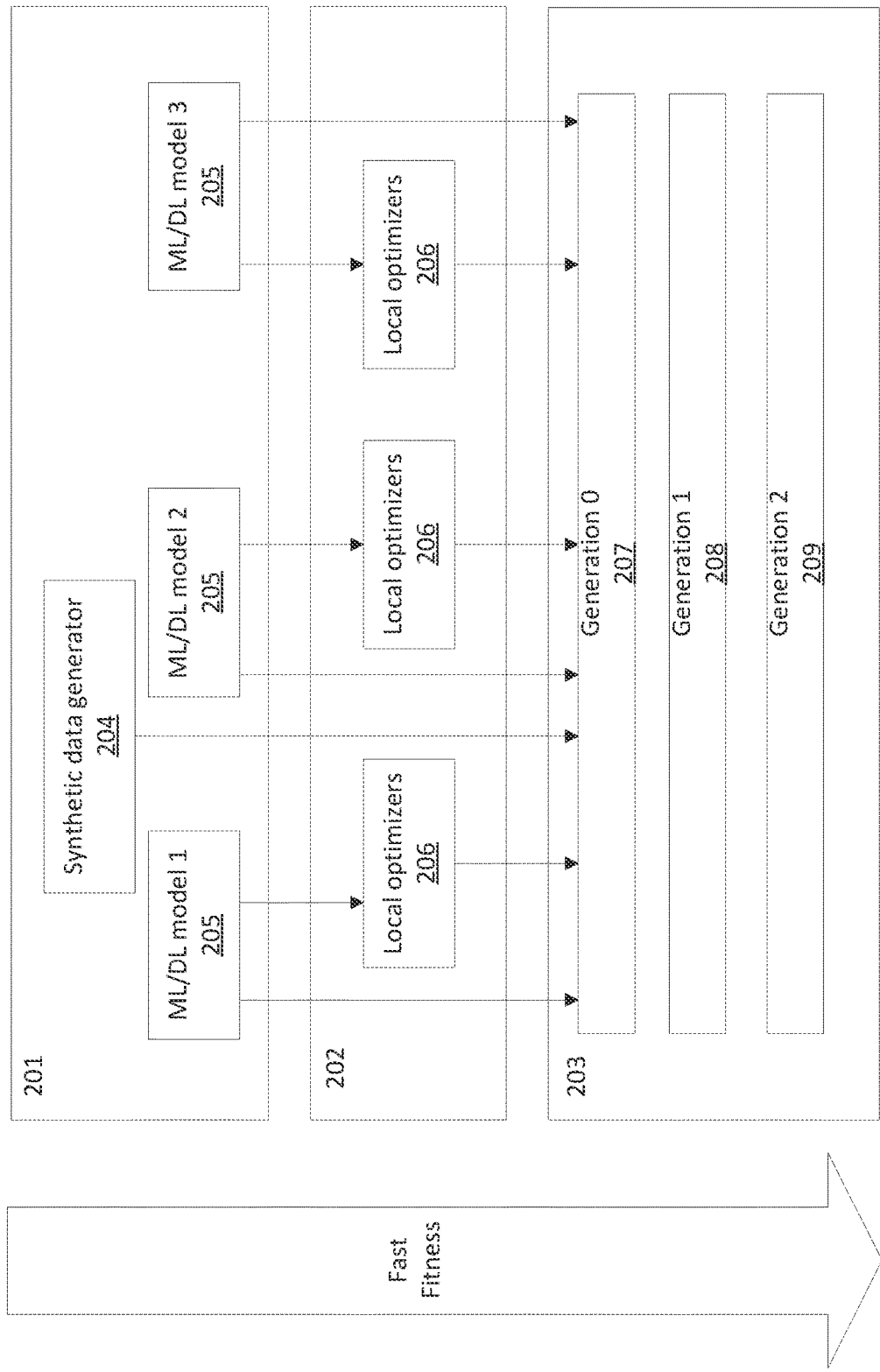
FIG. 2 shows a flowchart of variogram modeling stages in accordance with one or more embodiments.

More specifically, in one or more embodiments, FIG. 2 describes three stages (201, 202, 203) of variogram modelling. The variogram optimization uses variants of global optimization methods, as the variogram optimization function is a non-convex problem. The optimization is based on the fast mode convergence, according to which deep learning models are faster than conventional training methods in order of magnitude. The fast model convergence is achieved by combining multiple stages of models (201-203).

In some embodiments, initial parameters used for variogram modeling are based on synthetic data. The synthetic data is generated to suggest the initial parameters that close to the best fit values. The initial parameters are fed to local optimization algorithm to calibrate their values to match observation data being modeled. After the local optimization algorithm calibrates the parameters, the calibrated parameters are used to constitute the first genome od genetics algorithm (GA) optimization process. This embodiment results with a significant decrease in required processing time of variogram fitting parameters, compared to using the genetic algorithm alone.

Block 201 represents the first stage of the method for variogram modeling. The first stage involves developing a pre-trained deep learning model (205) on synthetic data (204) representing reservoir characterization parameters. The reservoir characterization parameters may be data on spatial and vertical facies of the reservoir, petrophysical properties distribution and labeled data of best fit variogram parameters. The pre-trained deep learning model (205) also encompasses the variable settings of various sedimentary and depositional environments. Further, the pre-trained deep learning model (205) predicts optimal variogram parameters. Using synthetic data (204) for pre-trained model (205) will achieve fast model convergence and improve the process of finding parametric equations of the variogram.

Block 202 represents the second stage of the method for variogram modeling. More specifically, in one or more embodiments, the second stage represents a local optimizer (202). The local optimizer (202) is an algorithm used to accelerate the convergence to the local optimal points or local minima. Iterative algorithms, used by the local optimizer, converge to the optimal point when their output iteratively gets closer to a specific value. The local optimizer (202) fine-tunes deep learning model (205) predictions to the closest optimal points. The fine-tuned predictions may be global optimal points, depending on the accuracy of the pre-trained deep learning models (205).

Block 203 represents the third stage of the method for variogram modeling. More specifically, the third stage represents a global optimizer (203). The global optimizer (203) is genetic algorithm used to assess whether a better fitting parameter exists. The search for the better fitting parameter is done globally in a given data space. Based on the parameters produced in the first (201) and second stage (202), the global optimizer (203) creates new generations (207-209) of data and tests them to obtain the fitness score. The generations (207-209) with the highest fitness score are used to set variogram parameters for the dataset under analysis.

Figure 3:
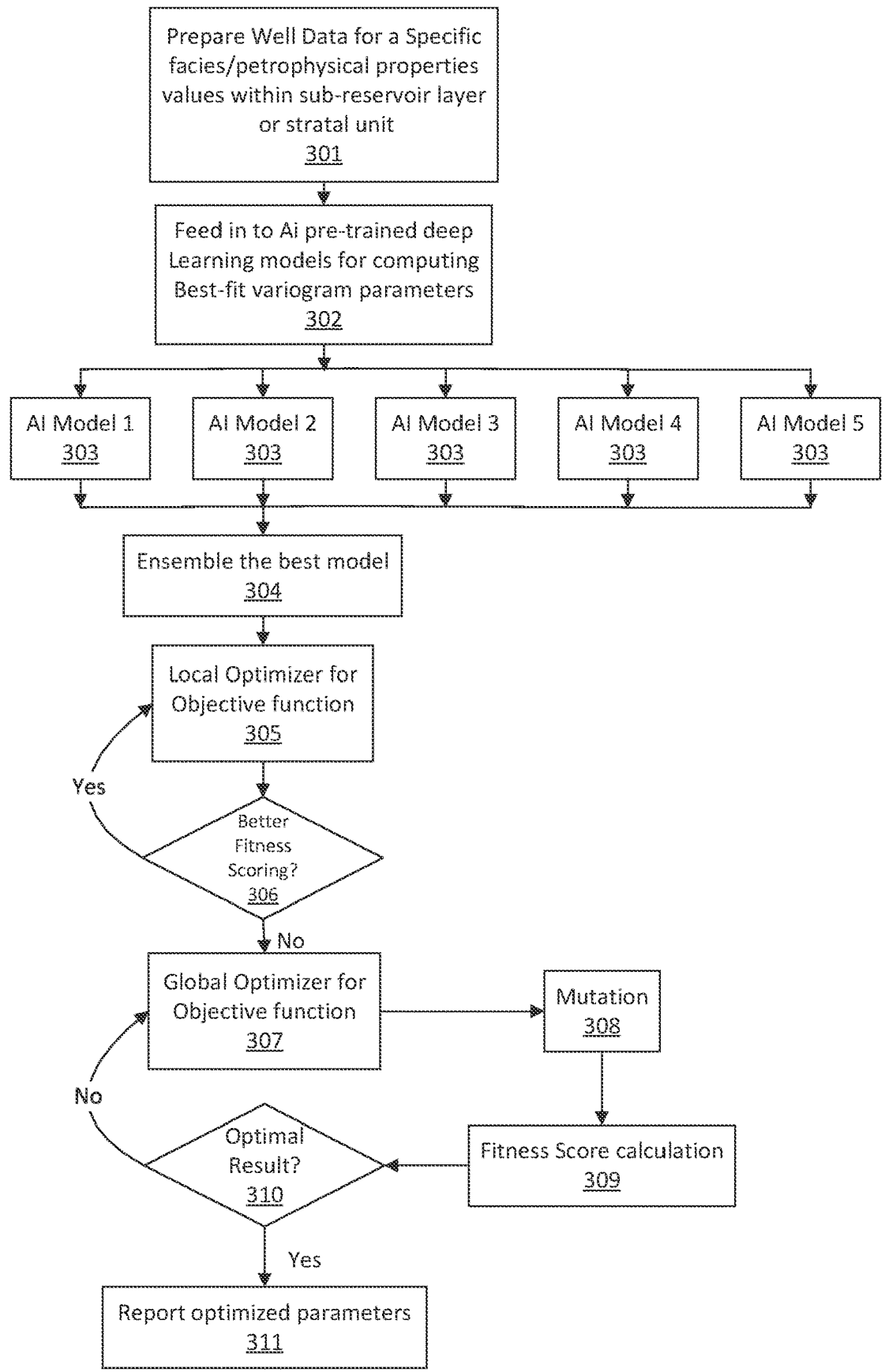
FIG. 3 shows a flowchart in accordance with one or more embodiments.

FIG. 3 shows a flowchart in accordance with one or more embodiments. Specifically, FIG. 3 describes a method for variogram modeling. While the various blocks in FIG. 3 are presented and described sequentially, one of the ordinary skill in the art will appreciate that some or all of the block may be executed in a different order, may be combined or omitted, and some or all of the blocks may be executed in parallel.

Initially in Block 301, the well data is prepared for specific petrophysical properties values within sub-reservoir layer. The synthetic well data (205) includes a plurality of varying zone anisotropy, geometric anisotropy, cyclicity and other forms represented in nested variogram driven by secondary or tertiary geological settings and depositional systems. Prepared synthetic data (205) does not have to be obtained by direct measurement, rather it may be generated by a computer simulation. The synthetic data (204) represents reservoir characterization parameters, such as spatial and vertical facies and petrophysical properties distribution, along with labeled data of best-fit variogram parameters. Further, the synthetic data (204) may be inclusive of all geologically plausible settings and variable data density. Robust data set yields to more precise spatial modeling of petrophysical properties.

During data preprocessing, data for example may be cleaned, as a process of correcting and deleting inaccuracies in the existing data. Further, data may be harmonized to improve structure of data properties. Finally, synthetic data (205) needs to be generated in the way to be similar to the real data, as the utility of synthetic well data (205) depends on similarity to the real data in certain application area.

Synthetic data (204) enhances the process by providing accurate labels of properties, including the labeling that may be very expensive to obtain by humans. Further, after a synthetic environment is ready, it is cheap to produce robust data sets. The generated synthetic data (204) may be based on small amount of real data.

In Block 302, the synthetic data (204) is used to train deep learning models for computing the best fit variogram parameters. The deep learning system is trained to find the parameters of variogram for any dataset correctly. Although, it is not guaranteed that this deep learning system will provide the accurate solution then it would have a high probability to provide a very close solution than random number generation technique used in global optimization methods. Applying the pre-trained deep learning system may speed up the convergence.

In Blocks 303 and 304 the deep learning system predicts optimal variogram parameters. For example, the pre-trained deep learning model (205) may be U-Net, which is a convolutional neural network modified and extended to work with fewer training data and to yield more precise segmentations. Convolutional networks are a specialized type of neural networks that use convolution in at least one of their layers. Developing a deep learning model (205) requires specifying various layers of computation. The layers for example may be an input layer, an output layer and one or more hidden layers etc. The solution, obtained from the deep learning system, may be measured based on fitness function. Specifically, the fitness function evaluates how close a given solution is to the optimum solution of a given problem. Each solution is assigned a fitness score and solutions may be compared and assessed based on the fitness score.

In Block 305, it is assumed that the given solution is not correct, and that a more optimal solution is in proximity. Parameters obtained by the solution are fed to local optimization algorithm to calibrate their values to match observation data being modeled. The local optimizer (202) finds the closest local optimal point of the values generated by the pre-trained deep learning system. This process is repetitive, and it lasts until there are no local optimal points with bigger fitness score in the proximity. The algorithm for the local optimizer (202) for example may be gradient descent, simulated annealing, random forest, support vector machine, and multi-layer perceptron.

The iterative process continues with Block 306, which assesses if the fitness score of the new solution is better than the previous solution. The fitness score is computed based on the solution of the deep learning model. The fitness function evaluates accuracy of the given solution to the optimum solution. Each solution is assigned a fitness score and the solutions may be compared according to it. The solutions with the biggest fitness score are selected as the best candidates for reproduction or as an optimal solution. If the new solution has a better fitness score, the local optimizer (202) will continue to work with that solution to try to find a new local optimal point. This process iterates as long as the local optimizer (202) is able to find a new local optimal point with a better fitness score. Once when the new iterations do not yield a solution with a better fitness score, the iterative process is stopped, and the solution is passed to the next stage. The initial fitness scores are obtained from the pre-trained deep learning system. The solutions with the highest fitness scores are representing the local optimal point.

The local optimal point with the biggest score is selected as a final solution. According to the local optimizer (202) that may be the global optimal point or at least some if not most of the parameters that deep learning model (205) generated will have high probability of being correct or close to correct. The solution is forwarded to the global optimizer (203) and it is used to find the global optimal point.

In Block 307, it is assumed that the given solution is not correct, and that if the closest optimal point is not the global optimal point, then at least some if not most of the parameters that deep learning model (205) generated will have high probability of being correct or close to correct. Therefore, the genetic algorithm is introduced in this stage. The solution is added to the genetic algorithm population to be accounted for in next population round.

The genetic algorithm is a randomized search algorithm that imitates the mechanics of natural selection and natural genetics. The initial seed parameters of the genetic algorithm are set to the parameters generated by the pre-trained deep learning system and the parameters generated by the local optimizer (202). The genetic algorithm proceeds to creating new generations (207-209) passing fitness scores along the process. Running the process for large number of generations (207-209) will result in settling to the highest fitness scoring possible, which can be used to set variogram parameters for the dataset under analysis.

Through Blocks 307-309, the genetic algorithm passes through the main operators, a reproduction, a crossover, and a mutation (308). The genetic algorithm initializes the population and evaluates every parameter based on their fitness score. The reproduction a process based on the fitness function, where samples with better fitness score are used to create new generations (207-209) of data. Selected data is combined in the crossover and it results with creation of new generations (207-209) od data. Occasionally, the data will undergo small random alterations called mutations (308), to ensure that the important information contained in data does not get lost prematurely. Finally, the fitness score of the new generation is measured and compared to the fitness score of the previous generation in Block 310.

If the fitness score of the new generation is not the optimal result, the global optimizer (203) continues to create new generations (207-209) of data, using the above-described process, until the global optimal point is determined. Once the global optimal point is determined the optimized parameters are reported in Block 311. The optimized parameters may be applied with a stochastic interpolation algorithm to build a model of petrophysical properties in earth modeling.

In certain cases, the pre-trained deep learning model does not converge to a local or global optimal point. Divergent algorithm has does not help in construction of variogram model. Such cases may be avoided by further fine-tuning pre-trained machine learning model with specific dataset to improve the accuracy in the future iterations.

Figure 4:
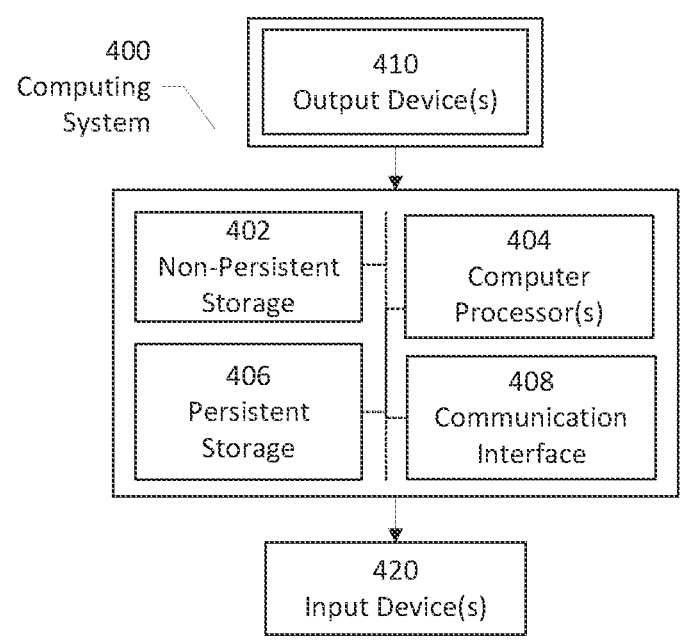
FIG. 4 shows a computer system in accordance with one or more embodiments.

Embodiments may be implemented on a computing system. Any combination of mobile, desktop, server, router, switch, embedded device, or other types of hardware may be used. For example, as shown in FIG. 4, the computing system (400) may include one or more computer processors (404), non-persistent storage (402) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (408) (e.g., Bluetooth interface, infrared interface, network interface, optical interface, etc.), and numerous other elements and functionalities.

The computer processor(s) (404) may be an integrated circuit for processing instructions. For example, the computer processor(s) may be one or more cores or micro-cores of a processor. The computing system (400) may also include one or more input devices (420), such as a touchscreen, keyboard, mouse, microphone, touchpad, electronic pen, or any other type of input device.

The communication interface (408) may include an integrated circuit for connecting the computing system (400) to a network (not shown) (e.g., a local area network (LAN), a wide area network (WAN) such as the Internet, mobile network, or any other type of network) and/or to another device, such as another computing device.

Further, the computing system (400) may include one or more output devices (410), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (404), non-persistent storage (402), and persistent storage (406). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

While the disclosure has been described with respect to a limited number of embodiments, those skilled in the art, having benefit of this disclosure, will appreciate that other embodiments may be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method for variogram modeling, the method comprising:
   obtaining, by a computer processor, a synthetic well data and a well data for subsurface rock properties of interest in a targeted reservoir zone;
   training, by the computer processor, a first machine learning model using the synthetic well data as inputs;
   outputting, by the computer processor, a plurality of variogram parameters predicted by using the pre-trained first model for the subsurface rock properties of interest in the targeted reservoir zone, wherein the well data for the subsurface rock properties of interest in the targeted reservoir zone is used as input;
   training, by the computer processor, a second machine learning model using the variogram parameters derived from the first machine learning model as starting parameters, wherein the well data for the subsurface rock properties of interest in the targeted reservoir zone is used as input;
   outputting, by the computer processor, a plurality of variogram parameters predicted by using the trained second model for the subsurface rock properties of interest in the targeted reservoir zone, wherein the well data for the subsurface rock properties of interest in the targeted reservoir zone is used as input;
   training, by the computer processor, a third machine learning model using the variogram parameters derived from the second machine learning model as starting parameters, wherein the well data for the subsurface rock properties of interest in the targeted reservoir zone is used as input; and
   outputting, by the computer processor, a plurality of final variogram parameters predicted by using the trained third model for the subsurface rock properties of interest in the targeted reservoir zone, wherein the well data for the subsurface rock properties of interest in the targeted reservoir zone is used as input.

2. The method of claim 1, wherein the synthetic well data represents spatial and vertical subsurface rock properties and petrophysical properties distribution along with a labeled data of the best-fit variogram parameters.

3. The method of claim 1, wherein the synthetic well data includes a plurality of varying zone anisotropy, geometric anisotropy, cyclicity and other forms represented in nested variogram driven by secondary or tertiary geological settings and depositional systems.

4. The method of claim 1, wherein the first machine learning algorithm may be selected from a group consisting of a convolutional neural network, a deep neural networks, and a recurrent neural networks.

5. The method of claim 1, wherein the second machine learning algorithm may be selected from a group consisting of gradient descent, a simulated annealing, a random forest, a support vector machine, and a multi-layer perceptron.

6. The method of claim 1, wherein the third machine learning algorithm may be a genetic algorithm.

7. The method of claim 1, wherein the three machine learning algorithms are combined sequentially to achieve a fast model convergence.

8. The method of claim 1, wherein a fitness function is computed for each parameter, the fitness function determining a probability that the parameter will be selected for a next generation.

9. The method of claim 1, wherein the variogram parameters may be selected from a group consisting of a nugget, a model type, a sill, an azimuth, a range 1 for major direction, a range 2 for minor direction, and an anisotropy.

10. The method of claim 1, wherein the final variogram parameters may be applied with a stochastic interpolation algorithm to build a model of petrophysical properties in earth modeling.

11. A system for variogram modeling, comprising:
a processor comprising a computer processing unit capable of executing instructions stored in a non-transitory computer storage medium which causes the processor to perform functions comprising:
obtaining a synthetic well data and a well data for subsurface rock properties of interest in a targeted reservoir zone;
training a first machine learning model using the synthetic well data as inputs;
outputting a plurality of variogram parameters predicted by using the pre-trained first model for the subsurface rock properties of interest in the targeted reservoir zone, wherein the well data for the subsurface rock properties of interest in the targeted reservoir zone is used as input;
training a second machine learning model using the variogram parameters derived from the first machine learning model as starting parameters, wherein the well data for the subsurface rock properties of interest in the targeted reservoir zone is used as input;
outputting a plurality of variogram parameters predicted by using the trained second model for the subsurface rock properties of interest in the targeted reservoir zone, wherein the well data for the subsurface rock properties of interest in the targeted reservoir zone is used as input;
training a third machine learning model using the variogram parameters derived from the second machine learning model as starting parameters, wherein the well data for the subsurface rock properties of interest in the targeted reservoir zone is used as input; and
outputting a plurality of final variogram parameters predicted by using the trained third model for the subsurface rock properties of interest in the targeted reservoir zone, wherein the well data for the subsurface rock properties of interest in the targeted reservoir zone is used as input.

12. The system of claim 11, wherein the synthetic well data represents spatial and vertical subsurface rock properties and petrophysical properties distribution along with a labeled data of the best-fit variogram parameters.

13. The system of claim 11, wherein the synthetic well data includes a plurality of varying zone anisotropy, geometric anisotropy, cyclicity and other forms represented in nested variogram driven by secondary or tertiary geological settings and depositional systems.

14. The system of claim 11, wherein the first machine learning algorithm may be selected from a group consisting of a convolutional neural network, deep neural networks, recurrent neural networks.

15. The system of claim 11, wherein the second machine learning algorithm may be selected from a group consisting of a gradient descent, a simulated annealing, a random forest, a support vector machine, and a multi-layer perceptron.

16. The system of claim 11, wherein the third machine learning algorithm may be a genetic algorithm.

17. The system of claim 11, wherein the three machine learning algorithms are combined sequentially to achieve a fast model convergence.

18. The system of claim 11, wherein a fitness function is computed for each parameter, the fitness function determining a probability that the parameter will be selected for a next generation.

19. The system of claim 11, wherein the variogram parameters may be selected from a group consisting of a nugget, a model type, a sill, an azimuth, a range 1 for major direction, a range 2 for minor direction, and an anisotropy.

20. The system of claim 11, wherein the final variogram parameters may be applied with a stochastic interpolation algorithm to build a model of petrophysical properties in earth modeling.

* * * * *